(12) United States Patent
Khlat et al.

(10) Patent No.: US 8,774,065 B2
(45) Date of Patent: Jul. 8, 2014

(54) RADIO FRONT END AND POWER MANAGEMENT ARCHITECTURE FOR LTE-ADVANCED

(75) Inventors: Nadim Khlat, Cugnaux (FR); Alexander Wayne Hietala, Phoenix, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 138 days.

(21) Appl. No.: 13/460,861

(22) Filed: May 1, 2012

(65) Prior Publication Data

US 2012/0281597 A1 Nov. 8, 2012

Related U.S. Application Data

(60) Provisional application No. 61/481,311, filed on May 2, 2011.

(51) Int. Cl.
*H04B 7/00* (2006.01)

(52) U.S. Cl.
USPC .............................. 370/277; 330/127; 455/91

(58) Field of Classification Search
USPC ................ 370/277; 375/219; 455/553.1, 323; 330/127
See application file for complete search history.

(56) References Cited

U.S. PATENT DOCUMENTS

| | | | |
|---|---|---|---|
| 2006/0012425 A1* | 1/2006 | Ohnishi et al. ................ | 330/126 |
| 2008/0003797 A1 | 1/2008 | Kim | |
| 2009/0180403 A1 | 7/2009 | Tudosoiu | |
| 2010/0099366 A1 | 4/2010 | Sugar et al. | |
| 2011/0241787 A1 | 10/2011 | Mastovich | |
| 2012/0235735 A1 | 9/2012 | Spits et al. | |
| 2012/0320803 A1 | 12/2012 | Skarp | |

OTHER PUBLICATIONS

Notice of Allowance for U.S. Appl. No. 13/045,621, mailed Sep. 24, 2013, 10 pages.
Notice of Allowance for U.S. Appl. No. 13/045,604, mailed May 17, 2013, 11 pages.
Non-Final Office Action for U.S. Appl. No. 13/045,621, mailed May 31, 2013, 13 pages.

* cited by examiner

*Primary Examiner* — Andrew Lai
*Assistant Examiner* — Jamaal Henson
(74) *Attorney, Agent, or Firm* — Withrow & Terranova, P.L.L.C.

(57) ABSTRACT

A front end radio architecture (FERA) with power management is disclosed. The FERA includes a first power amplifier (PA) block having a first-first PA and a first-second PA, and a second PA block having a second-first PA and a second-second PA. First and second modulated switchers are adapted to selectively supply power to the first-first PA and the second-first PA, and to supply power to the first-second PA and the second-second PA, respectively. The first and second modulated switchers have a modulation bandwidth of at least 20 MHz and are both suitable for envelope tracking modulation. A control system is adapted to selectively enable and disable the first-first PA, first-second PA, the second-first PA, and the second-second PA. First and second switches are responsive to control signals to route carriers and received signals between first and second antennas depending upon a selectable mode of operation such as intra-band or inter-band operation.

26 Claims, 11 Drawing Sheets

RADIO FRONT END AND POWER MANAGEMENT ARCHITECTURE FOR LTE-ADVANCED

RELATED APPLICATIONS

This application claims the benefit of U.S. provisional patent application No. 61/481,311, filed May 2, 2011, the disclosure of which is incorporated herein by reference in its entirety. This patent application is also related to provisional patent application Ser. No. 13/045,604 entitled LTE-ADVANCED (4G) FRONT END RADIO ARCHITECTURE, filed Mar. 11, 2011, now U.S. Pat. No. 8,537,723; patent application Ser. No. 13/045,621 entitled SPLIT-BAND POWER AMPLIFIERS AND DUPLEXERS FOR LTE-ADVANCED FRONT END FOR IMPROVED IMD, filed Mar. 11, 2011, now U.S. Pat. No. 8,644,198; and provisional patent application Ser. No. 61/313,392 entitled LTE-ADVANCED FRONT END ARCHITECTURE, filed Mar. 12, 2010; the disclosures of which are incorporated herein by reference in their entireties.

FIELD OF THE DISCLOSURE

The present disclosure relates to front end radio architectures (FERAS) directed towards long term evolution advanced (LTE-Advanced) user equipment (UE).

BACKGROUND

A long term evolution advanced (LTE-Advanced) network standard has been developed to provide wireless data rates of 1 Gbps downlink and 500 Mbps uplink. The LTE-Advanced network standard also offers multi-carrier transmission and reception within a single band as well as multi-carrier transmission and reception within two separate bands. Multi-carrier transmission within a single band is referred to as intra-band transmission and reception. In contrast, multi-carrier transmission and reception within two different bands is referred to as inter-band transmission and reception. LTE-Advanced technology is also known as fourth generation (4G) technology.

LTE-Advanced operation requires a simultaneous dual carrier transmission in the same band (i.e., intra-band) and into different bands (i.e., inter-band). A transmission of dual LTE-Advanced carriers in a single band in a non-contiguous manner will result in an increased peak-to average ratio (PAR) of around 1 dB. This increase is over an increase of about 1 dB of PAR due to a use of clustered single carrier frequency division multiple access (SC-FDMA). The combined increase in PAR results in a significant negative impact on efficiency of a transmitter chain made up of a transceiver and a power amplifier (PA).

In this regard, envelope following techniques for linear modulation are highly desirable for LTE-Advanced customers and others in the years to come because envelope following and pseudo-envelope following enables a very efficient use of energy. Envelope following techniques employ envelope following systems that are power management systems that control power amplifiers (PAs) in such a way that the PA collector/drain voltage (referred to herein as VCC) follows an RF input signal envelope. The RF input signal envelope is an instantaneous voltage of a PA input RF signal, (referred to herein as VIN).

Implementing pseudo-envelope following improves overall efficiency of PA systems because a power management function is realized using high efficiency switcher systems. However, using envelope following techniques is not practical for transmitter chains that involve dual intra-band carriers due to a large bandwidth requirement that would be placed on a typical switching power supply. The reason for the large bandwidth requirement is that bandwidth is a function of frequency separation between the dual intra-band carriers. For the purpose of this disclosure, envelope following systems include pseudo-envelope following systems, wherein pseudo-envelope following is envelope tracking that includes power amplifier (PA) collector/drain voltage pre-distortion to ameliorate power amplifier nonlinearity. It should be understood that envelope following is sometimes referred to as envelope tracking by some.

Lack of practical envelope following systems present a major challenge for realizing front end radio architectures (FERAs) that are necessary for providing multi-carrier operation using intra-band and inter-band transmission and reception. FERAs that do not employ envelope following systems cannot operate efficiently due to the extra 2 dB of PAR.

FIG. 1 is a schematic of a related art front end radio architecture (FERA) 10 that is not configured to accept power from power management architectures that employ envelope following. The FERA 10 includes a transmitter block 12 for transmitting LTE Advanced multi-carrier signals. The FERA 10 also includes a first power amplifier (PA) 14 powered by a first switcher 16 and a second PA 18 powered by a second switcher 20.

A first duplexer 22 for an RF band A and a first receive (RX) diversity/multiple-input multiple-output (MIMO) filter 24 for an RF band B are coupled between the first PA 14 and a first band switch 26. The first duplexer 22 and the first RX diversity/MIMO filter 24 are selectively coupled to a first antenna 28 through the first band switch 26. The first duplexer 22 outputs signals RX_A captured by the first antenna 28. The first RX diversity/MIMO filter 24 outputs signals RX_B_DIV also captured by the first antenna 28. The band switch 26 is controlled by a control signal CTRL1.

A second duplexer 30 for the RF band B and a second RX diversity/MIMO filter 32 are coupled between the second PA 18 and a second band switch 34. The second duplexer 30 is selectively coupled to a second antenna 36 through the second band switch 34. The second duplexer 30 outputs signals RX_B captured by the second antenna 36. The second RX diversity/MIMO filter 32 outputs signals RX_A_DIV also captured by the second antenna 36.

The transmitter block 12 includes a first transmitter 38, a first RF modulator 40, a first radio frequency (RF) phase locked loop (PLL) 42, a second transmitter 44, a second RF modulator 46, and a second RF PLL 48. The transmitter block 12 further includes a multi-carrier combiner 50 for combining signals output from the first RF modulator 40 and the second RF modulator 46.

The related art FERA 10 can operate in an intra-band multi-carrier mode. During operation of the related art FERA 10 in the intra-band multi-carrier mode, the first transmitter 38 outputs analog baseband (ABB) signals to the first RF modulator 40. Similarly, the second transmitter 44 outputs ABB signals to the second RF modulator 46. In response, the first RF modulator 40 in cooperation with the first RF PLL 42 outputs a first carrier within the RF band A while the second RF modulator 46 in cooperation with the second RF PLL 48 outputs a second carrier that is also within the band A. The first PA 14 provides power amplification of the first carrier and the second carrier which are output through the first duplexer 22 to the first antenna 28.

The related art FERA 10 also includes an inter-band multicarrier mode. During operation of the related art FERA 10 using the inter-band multi-carrier mode, the first RF modulator 40 in cooperation with the first RF PLL 42 outputs a first carrier within the RF band A while the second RF modulator 46 in cooperation with the second RF PLL 48 outputs a second carrier within the RF band B. The first PA 14 provides power amplification of the first carrier which is output through the first duplexer 22 to the first antenna 28. The second PA 18 provides power amplification of the second carrier which is output through the second duplexer 30 to the second antenna 36.

While the related art FERA 10 offers a realizable architecture for LTE-Advanced operation, the related art FERA 10 is wasteful with regard to energy, in that the FERA 10 is not structured to take advantage of a high energy efficiency operation provided by envelope following systems. Energy efficiency in battery powered user equipment (UE) such as mobile terminals that implement LTE-Advanced operation is very important, since a relatively long operation time between battery charges is desirable.

FIG. 2 is a spectrum diagram that illustrates a common collector voltage (VCC) bandwidth (BW) switcher modulation requirement for intra-band dual carrier transmission. In particular, the modulation bandwidth of the switcher 16 (FIG. 1) and the switcher 20 (FIG. 1) is a function of an offset frequency Df between a carrier #1 and a carrier #2. Therefore, the higher the offset frequency Df between the carrier #1 and the carrier #2, the higher the modulation bandwidth must be. At some point, the offset frequency Df is large enough that related art approaches for modulating a VCC pseudo envelope following (PEF) signal via either the switcher 16 or the switcher 20 are no longer practical. For example, if the offset frequency is 40 MHz, then the supply modulation bandwidth needed for envelope tracking is about 1.5×(40 MHz+20 MHz) or about 90 MHz for LTE-Advanced carriers having around 20 MHz of bandwidth. A multiplier of 1.5 is a result of a square root operation of PEF calculation. Moreover, even if the offset frequency Df is equal to zero between two adjacent carriers having a 20 MHz bandwidth each, a resulting 50 MHz VCC BW is too large for efficient modulation of the VCC PEF via either the switcher 16 or the switcher 20. Thus, there is a need to practically meet the VCC BW switcher modulation bandwidth requirement in order to implement LTE-Advanced operation in a more efficient manner than is possible with the related art FERA 10.

SUMMARY

Embodiments of the present disclosure provide a front end radio architecture (FERA) and power management architecture for LTE-Advanced operation. The FERA includes a first power amplifier (PA) block having a first-first PA and a first-second PA, and a second PA block having a second-first PA and a second-second PA. First and second modulated switchers are adapted to selectively supply power to the first-first PA and the second-first PA, and to supply power to the first-second PA and the second-second PA, respectively. The first and second modulated switchers have a modulation bandwidth of at least 20 MHz and are both suitable for envelope tracking modulation. A control system is adapted to selectively enable and disable the first-first PA, first-second PA, the second-first PA, and the second-second PA. First and second switches are responsive to control signals to route carriers and received signals between first and second antennas depending upon a selectable mode of operation such as intra-band or inter-band operation.

The first modulated switcher is adapted to supply power to the first-first PA and the second-first PA, while the second modulated switcher is adapted to supply power to the first-second PA and the second-second PA. The first switch has a first control input, a first throw terminal, a second throw terminal, and a first pole terminal coupled to a first throw and a second throw, wherein the first switch is responsive to a first control signal to selectively close and open the first throw with the first throw terminal, and to selectively close and open the second throw with the second throw terminal. The second switch has a second control input, a third throw terminal, a fourth throw terminal, and a second pole terminal coupled to a third throw and a fourth throw, wherein the second switch is responsive to a second control signal to selectively close and open the third throw with the third throw terminal, and to selectively close and open the fourth throw with the fourth throw terminal.

The first duplexer is coupled between an output of the first-first PA and the first throw terminal, whereas the second duplexer is coupled between an output of the first-second PA and the second throw terminal. The third duplexer is coupled between an output of the second-first PA and the third throw terminal, whereas a fourth duplexer is coupled between an output of the second-second PA and the fourth throw terminal. The control system is adapted to selectively enable and disable the first-first PA, the first-second PA, the second-first PA, and the second-second PA, and to provide the first control signal and the second control signal.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Embodiments of the present disclosure provide front end radio architecture (FERA) and power management architecture for LTE-Advanced operation. In particular, the FERA and power management of the present disclosure is configured to employ envelope following that is compatible with existing bandwidth limited to 20 MHz LTE-Advanced for dual carriers implemented in both intra-band and inter-band scenarios.

Figure 1:
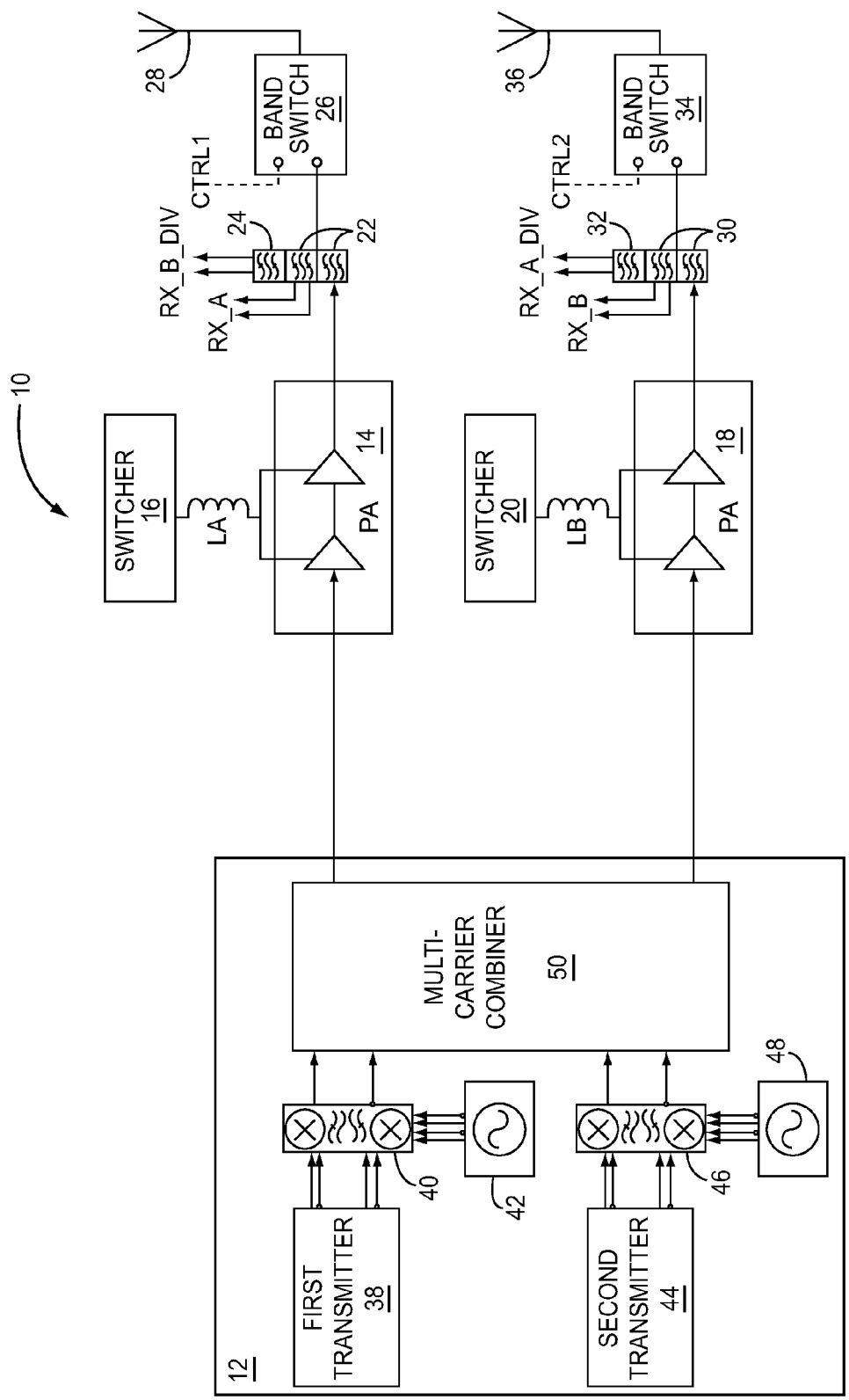
FIG. 1 is a schematic of a related art front end radio architecture (FERA) that is not configured to accept power from power management architectures that employ envelope following.
Figure 2:
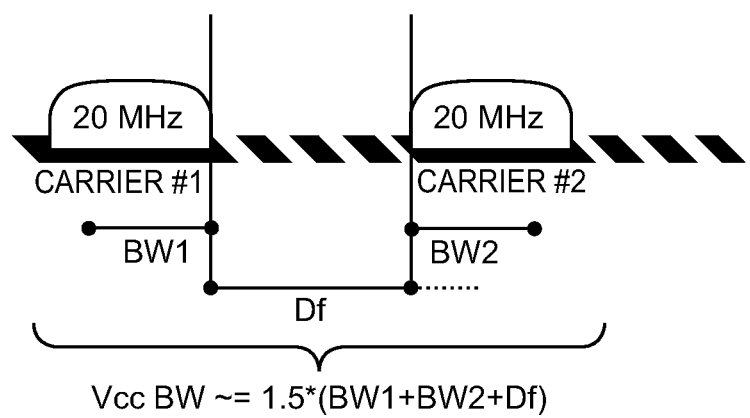
FIG. 2 is a spectrum diagram that illustrates a common collector voltage (VCC) bandwidth (BW) switcher modulation requirement for intra-band dual carrier transmission.
Figure 3:
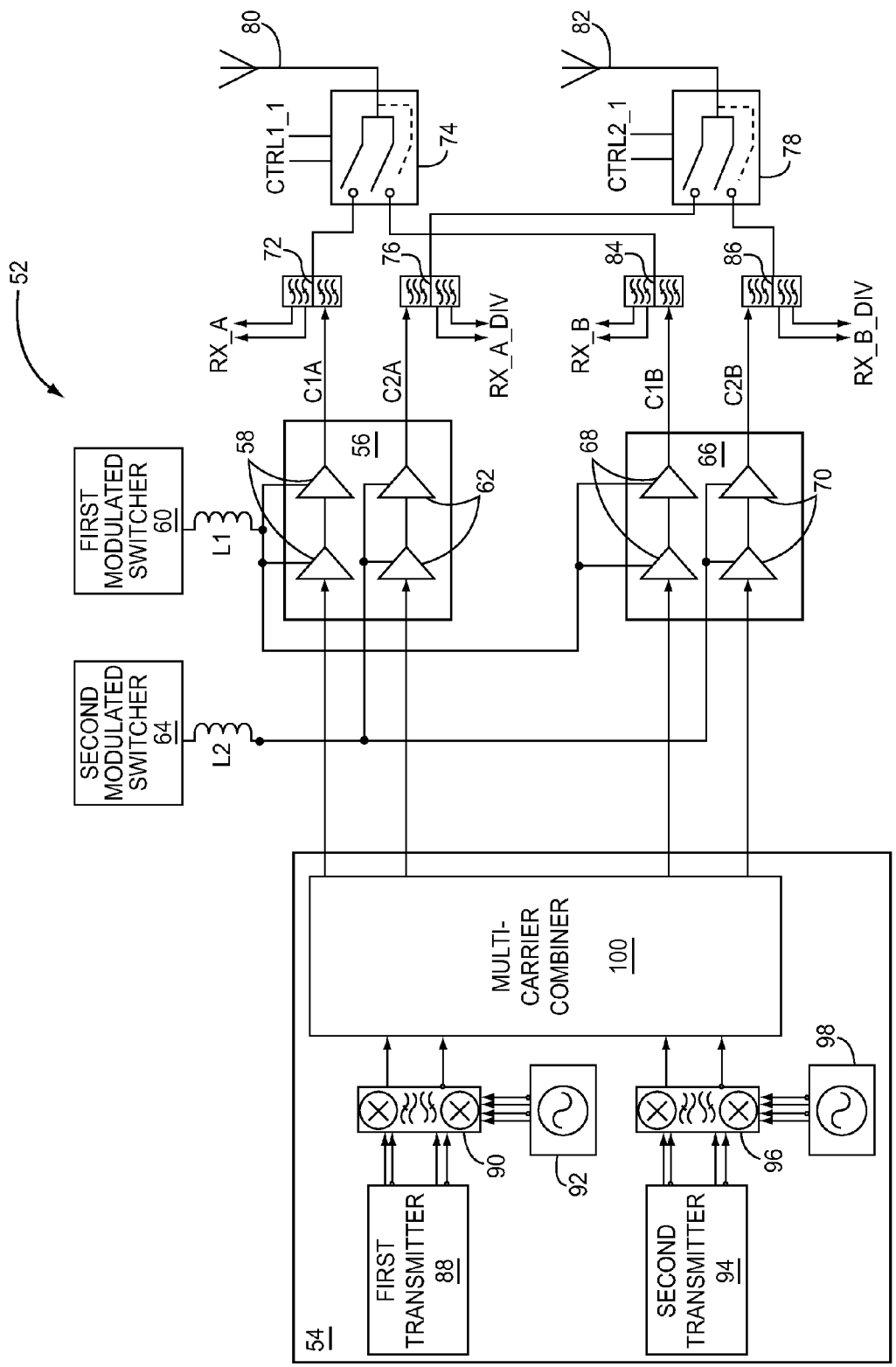
FIG. 3 is a schematic of a FERA that in accordance with the present disclosure is configured for operation with envelope following techniques.

FIG. 3 is a schematic of a FERA 52 that in accordance with the present disclosure is configured for operation with envelope following techniques. The FERA 52 includes a transmitter block 54 for transmitting LTE Advanced multi-carrier signals. The FERA 52 also includes a first PA block 56 having a first-first PA 58 that is selectively powered by a first modulated switcher 60 and a first-second PA 62 that is selectively powered by a second modulated switcher 64. The FERA 52 further includes a second PA block 66 having a second-first PA 68 that is selectively powered by the first modulated switcher 60 and a second-second PA 70 that is selectively powered by the second modulated switcher 64. The first modulated switcher 60 has a first output filter comprising a first inductor L1, while the second modulated switcher 64 includes a second output filter comprising a second inductor L2.

A first duplexer 72 for a first band A carrier C1A and a band A receive signal RX_A is coupled between an output of the first-first PA 58 and a first terminal of a first single pole double throw (SP2T) switch 74. A second duplexer 76 for a second band A carrier C2A and a band A diversity/MIMO receive signal RX_A_Div is coupled between an output of the first-second PA 62 and a first terminal of a second SP2T switch 78. The first duplexer 72 is selectively coupled to a first antenna 80 through the first SP2T switch 74. The first duplexer 72 outputs the receive signal RX_A captured by the first antenna 80. The second duplexer 76 is selectively coupled to a second antenna 82 through the second SP2T switch 78. The second duplexer 76 outputs the diversity/MIMO receive signal RX_A_DIV captured by the second antenna 82. The first SP2T switch 74 is controllable by a first control signal CTRL1_1, whereas the second SP2T switch 78 is controllable by a second control signal CTRL2_1.

A third duplexer 84 for a first band B carrier C1B and a band B receive signal RX_B is coupled between an output of the second-first PA 68 and a second terminal of the first SP2T switch 74. A fourth duplexer 86 for a second band B carrier C2B and a band B diversity/MIMO receive signal RX_B_Div is coupled between an output of the second-second PA 70 and a second terminal of a second SP2T switch 78. The third duplexer 84 is selectively coupled to the first antenna 80 through the first SP2T switch 74. The third duplexer 84 outputs the receive signal RX_B captured by the first antenna 80. The fourth duplexer 86 is selectively coupled to the second antenna 82 through the second SP2T switch 78. The fourth duplexer 86 outputs the diversity/MIMO receive signal RX_B_DIV captured by the second antenna 82.

The transmitter block 54 includes a first transmitter 88, a first RF modulator 90, a first radio frequency (RF) phase locked loop (PLL) 92, a second transmitter 94, a second RF modulator 96, and a second RF PLL 98. The transmitter block 54 further includes a multi-carrier combiner 100 for combining signals output from the first RF modulator 90 and the second RF modulator 96.

The FERA 52 can operate in an intra-band multi-carrier mode. During operation of the FERA 52 in the intra-band multi-carrier mode, the first transmitter 88 outputs analog baseband (ABB) signals to the first RF modulator 90. Similarly, the second transmitter 94 outputs ABB signals to the second RF modulator 96. In response, the first RF modulator 90 in cooperation with the first RF PLL 92 outputs a first carrier, C1A, within RF band A while the second RF modulator 96 in cooperation with the second RF PLL 98 outputs a second carrier, C2A, that is also within the band A. The first-first PA 58 provides power amplification of the first carrier, C1A, which is output through the first duplexer 72 to the first antenna 80. The first-second PA 62 provides power amplification of the second carrier, C2A, which is output through the second duplexer 76 to the second antenna 82.

The FERA 52 also includes an inter-band multicarrier mode. During operation of the FERA 52 using the inter-band multi-carrier mode, the first RF modulator 90 in cooperation with the first RF PLL 92 outputs a first carrier within the RF band A while the second RF modulator 96 in cooperation with the second RF PLL 98 outputs a second carrier within the RF band B. The first PA block 56 provides power amplification of the first carrier, which is output through the first duplexer 72 to the first antenna 80. The second PA block 66 provides power amplification of the second carrier, which is output through the fourth duplexer 86 to the second antenna 82.

Figure 4:
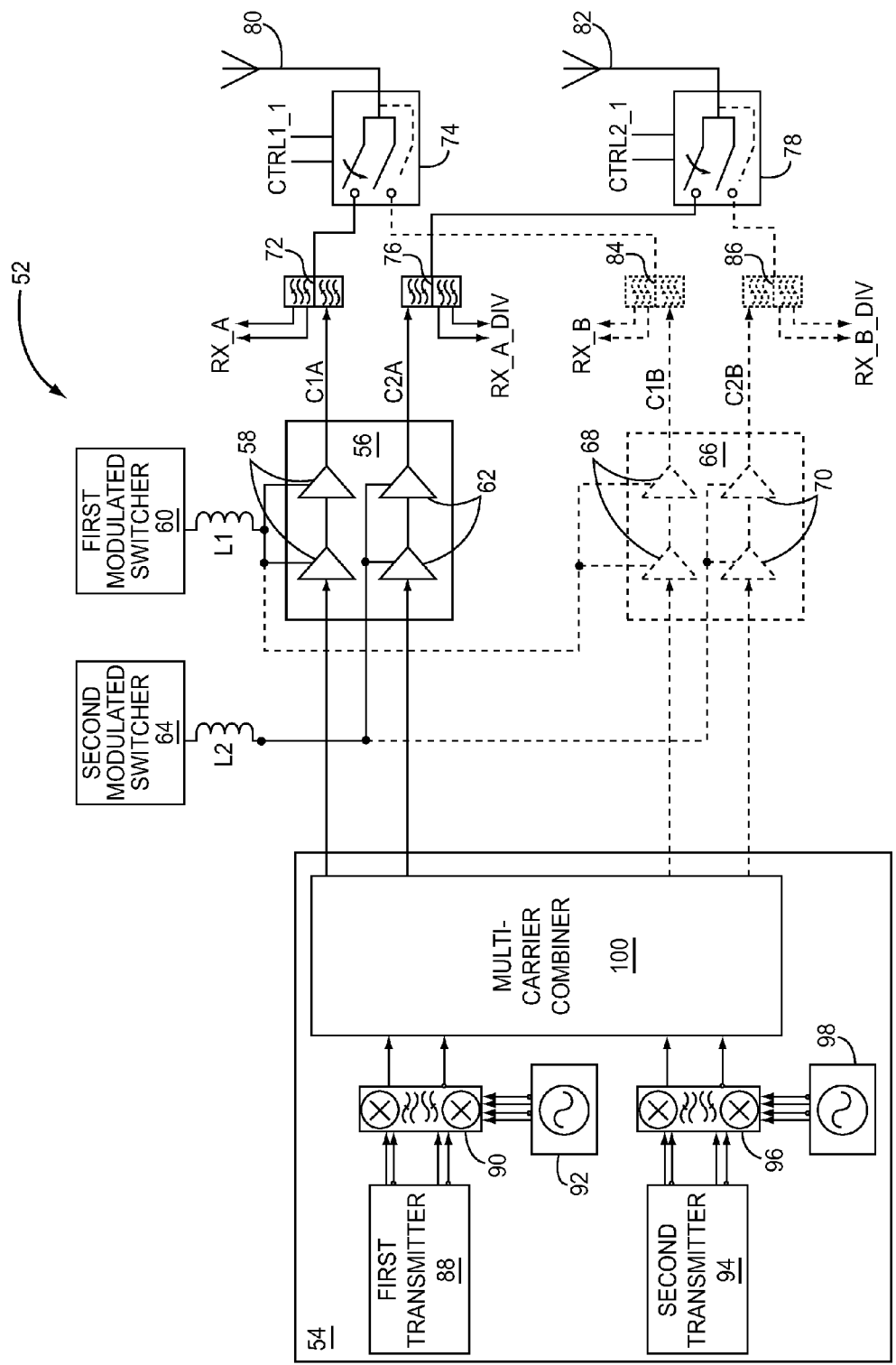
FIG. 4 is a schematic of the FERA during intra-band operation for band A.

FIG. 4 is a schematic of the FERA 52 during intra-band operation for band A. Dashed lines in FIG. 4 represent deactivated or unused components. In the case of intra-band carrier aggregation into band A, the second PA block 66 is deactivated, while the third duplexer 84 and the fourth duplexer 86 are unused. However, the first PA block 56 remains completely energized with the first-first PA 58 being supplied with power from the first modulated switcher 60 and the first-second PA 62 being supplied with power from the second modulated switcher 64. The CTRL1_1 signal closes the first throw of the first SP2T switch 74 so that the first carrier C1A is transmitted from the first antenna 80, while the band A receive signal RX_A is captured by the first antenna 80 and output from the first duplexer 72. Similarly, the CTRL2_1 signal closes a first throw of the second SP2T switch 78 so that the second carrier C2A is transmitted from the second antenna 82, and so that the band A diversity/MIMO receive signal RX_A_DIV captured by the second antenna 82 is output from the second duplexer 76.

Figure 5:
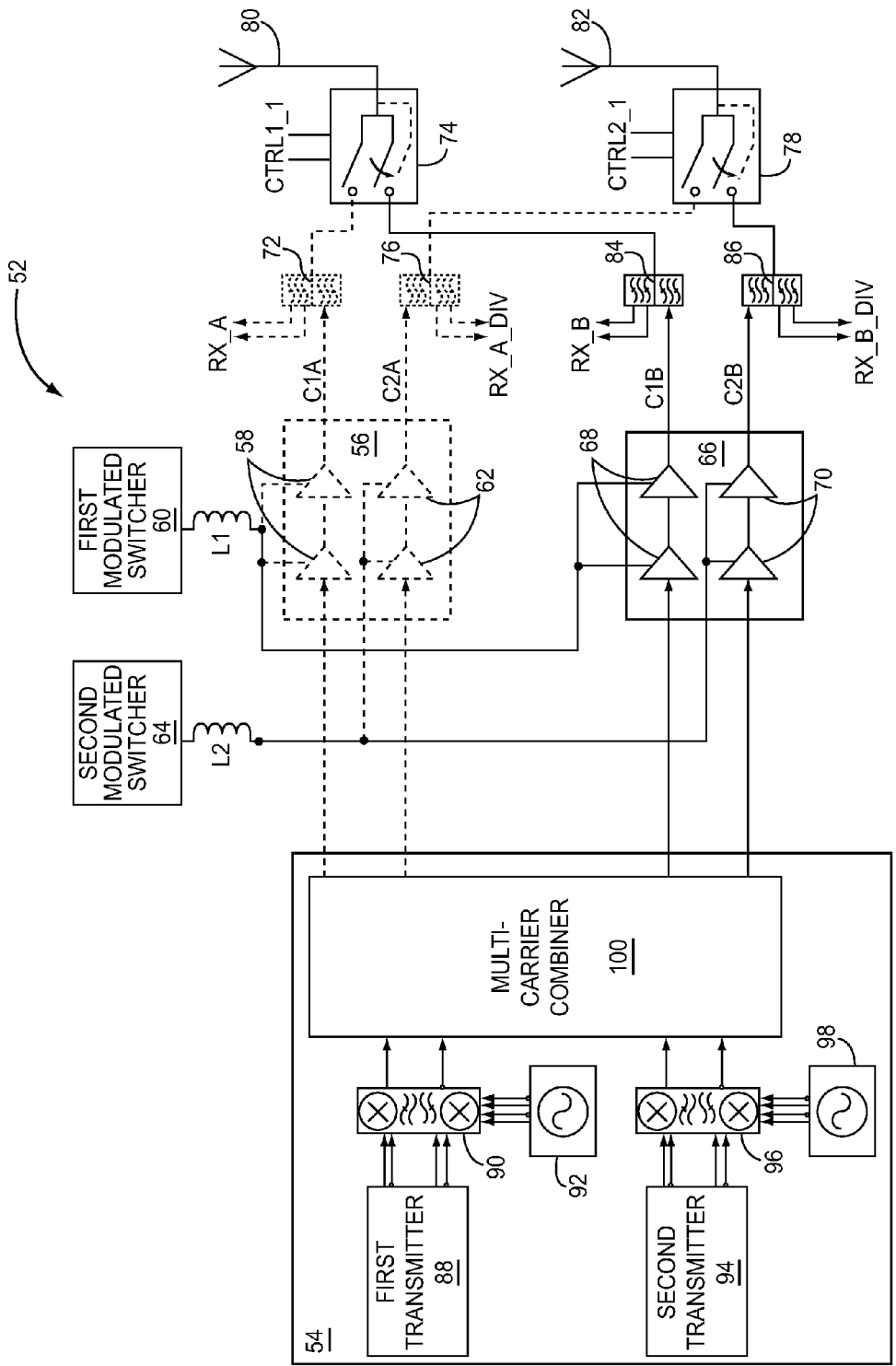
FIG. 5 is a schematic of the FERA during intra-band operation for band B.

FIG. 5 is a schematic of the FERA 52 during intra-band operation for band B. Dashed lines in FIG. 5 represent deactivated or unused components. In the case of intra-band carrier aggregation into band B, the first PA block 56 is deactivated, while the first duplexer 72 and the second duplexer 76 are unused. However, the second PA block 66 remains completely energized with the second-first PA 68 being supplied with power from the first modulated switcher 60, and the second-second PA 70 being supplied with power from the second modulated switcher 64. The CTRL1_1 signal closes a second throw of the first SP2T switch 74 so that the first carrier C1B is transmitted from the first antenna 80, and so that the band B receive signal RX_B captured by the first antenna 80 is output from the third duplexer 84. Similarly, the CTRL2_1 signal closes a second throw of the second SP2T switch 78 so that the second carrier C2B is transmitted from the second antenna 82, and so that the band B diversity/MIMO receive signal RX_B_DIV captured by the second antenna 82 is output from the fourth duplexer 86.

Figure 6:
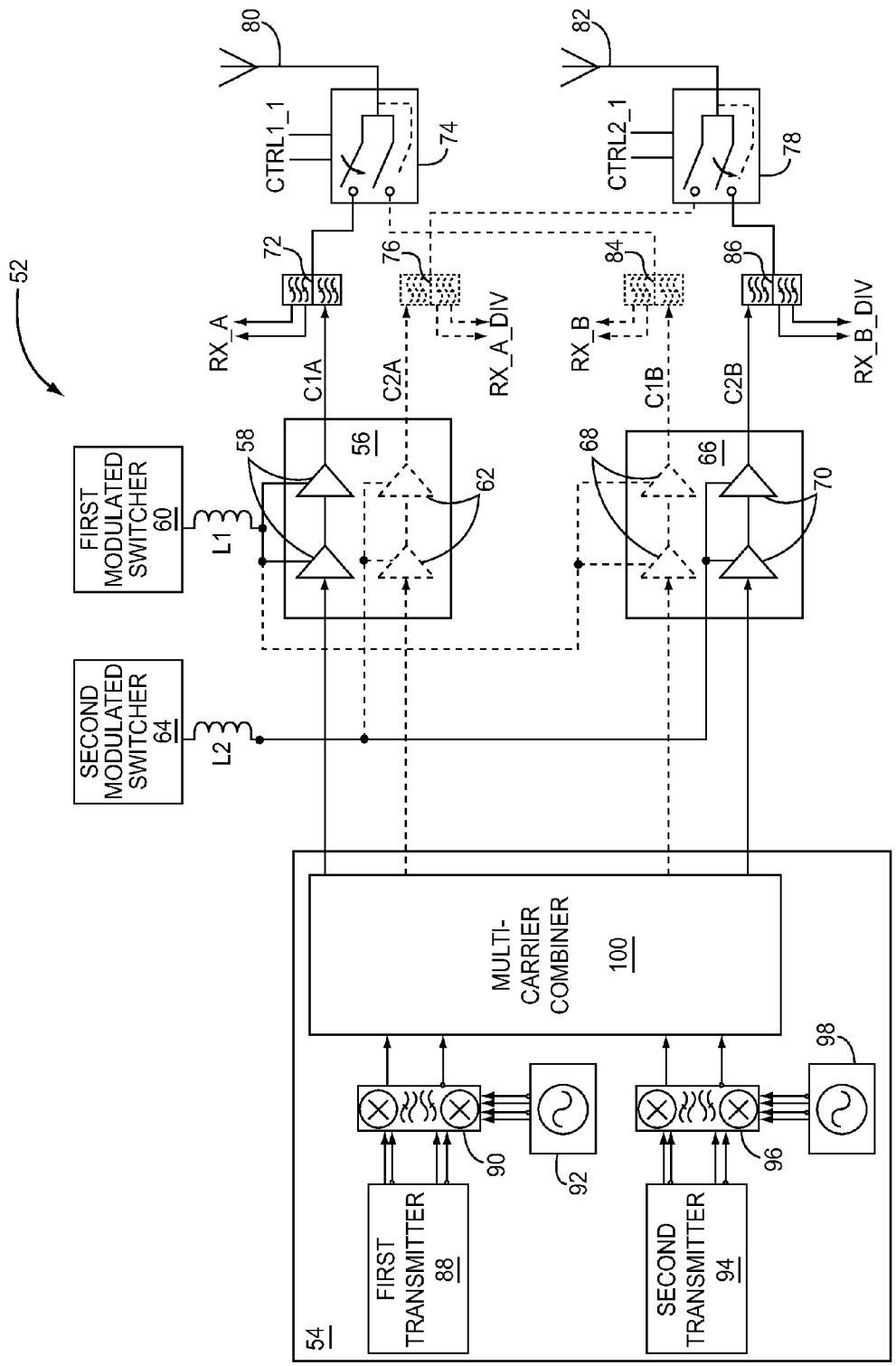
FIG. 6 is a schematic of the FERA during intra-band operation between band A and band B.

FIG. 6 is a schematic of the FERA 52 during intra-band operation between band A and band B. Dashed lines represent deactivated or unused components. In the case of intra-band carrier aggregation between band A and band B, the first PA block 56 and the second PA block 66 are only partially energized. In particular, the first-first PA 58 is powered by the first modulated switcher 60 and the second-second PA 70 is powered by the second modulated switcher 64, while the second-first PA 68 and the first-second PA 62 are deactivated. The second duplexer 76 and the third duplexer 84 are unused. The control signal CTRL1_1 closes the first throw of the first SP2T switch 74 so that the first carrier C1A is transmitted from the first antenna 80, and so that the band A receive signal RX_A is output from the first duplexer 72. Similarly, the control signal CTRL2_1 closes the second throw of the second SP2T switch 78 so that the second carrier C2B is transmitted from the second antenna 82, and so that the diversity/MIMO receive signal RX_B_DIV is output from the fourth duplexer 86.

Figure 7:
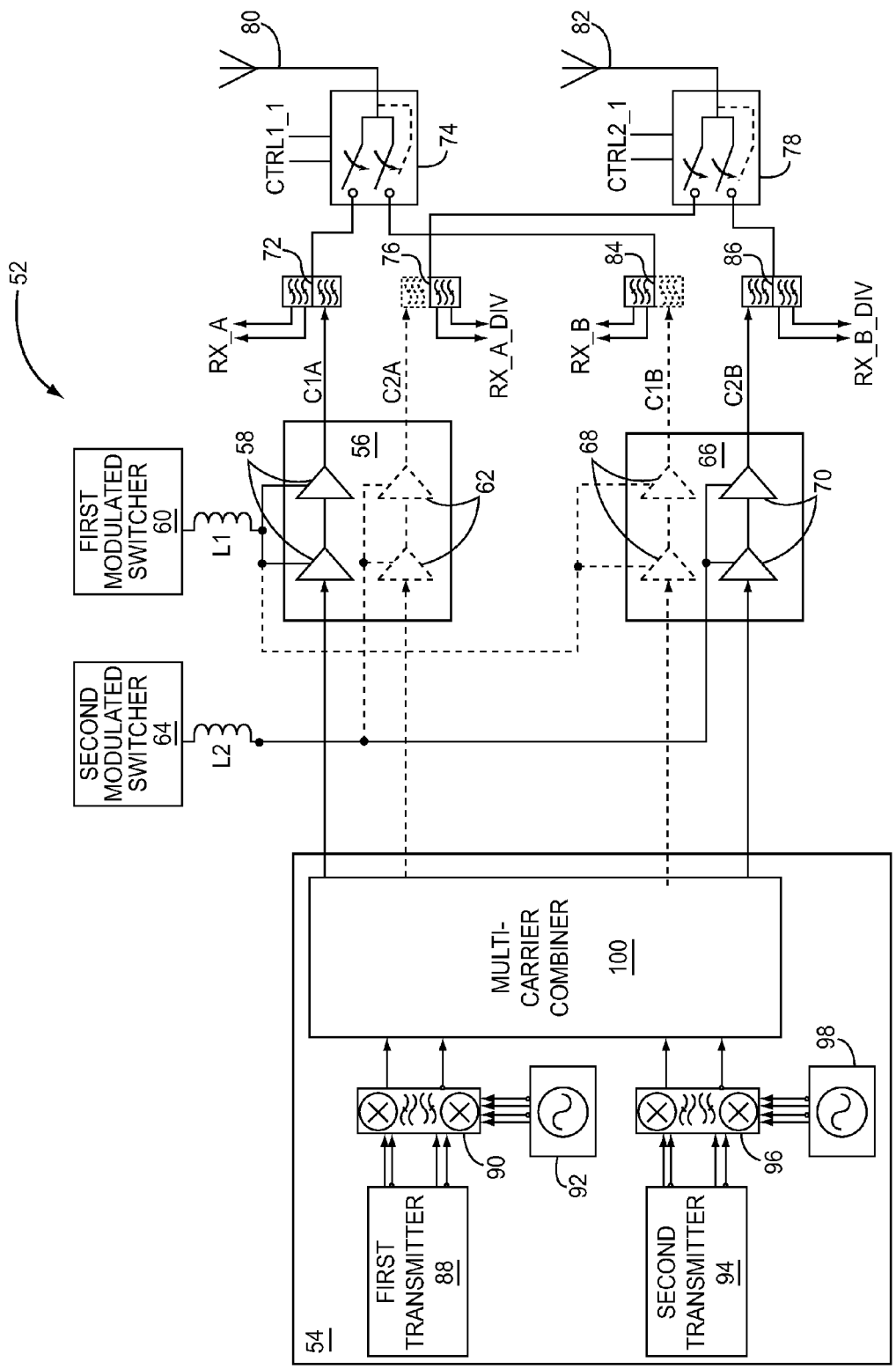
FIG. 7 is a schematic of the FERA during intra-band operation between band A and band B with receive diversity using MIMO.

FIG. 7 is a schematic of the FERA 52 during intra-band operation between band A and band B with receive diversity using MIMO. Dashed lines represent deactivated or unused components. In the case of intra-band carrier aggregation between band A and band B with receive diversity using MIMO, the first PA block 56 and the second PA block 66 are only partially energized as in FIG. 6. However, in order to realize diversity using MIMO for both band A and band B, the first and second throws of the first SP2T switch 74 and the second switch 78 are closed by the control signals CTRL1_1 and CTRL2_1. In this manner, the first carrier C1A is transmitted from the first antenna 80, while the band A receive signal RX_A captured by the first antenna 80 is output from the first duplexer 72, and the diversity/MIMO receive signal RX_A_DIV captured by the second antenna 82 is output from the second duplexer 76. Similarly, the second carrier C2B is transmitted from the second antenna 82, while the band B receive signal RX_B captured by the first antenna 80 is output from the third duplexer 84, and the diversity/MIMO receive signal RX_B_DIV captured by the second antenna 82 is output from the fourth duplexer 86.

Figure 8:
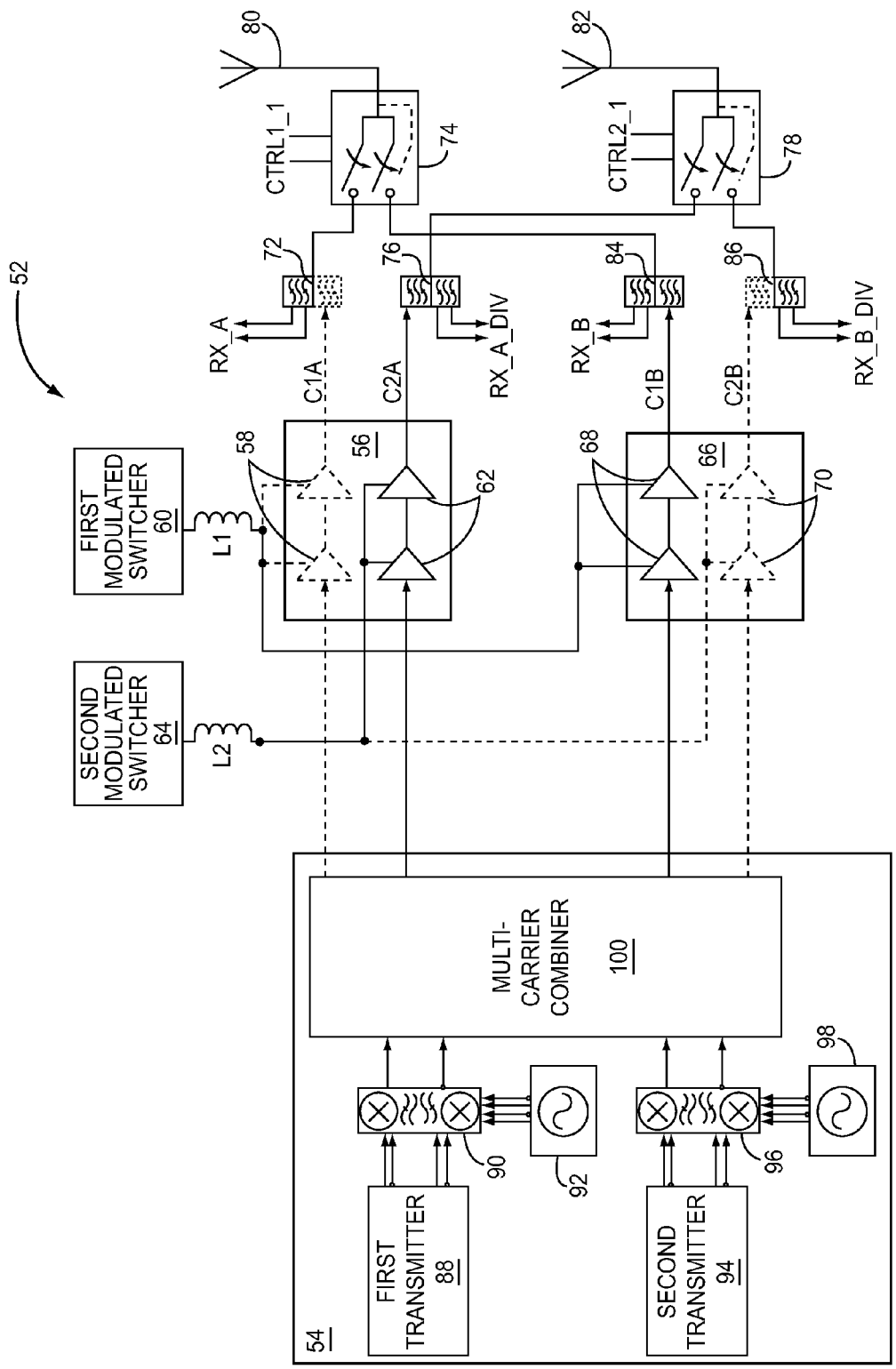
FIG. 8 is a schematic of the FERA during intra-band operation between band A and band B with receive diversity/MIMO and swapped carrier transmission.

FIG. 8 is a schematic of the FERA 52 during intra-band operation between band A and band B with receive diversity using MIMO and swapped carrier transmission. Dashed lines represent deactivated or unused components. In the case of intra-band carrier aggregation between band A and band B with receive diversity using MIMO and swapped carrier transmission, the first PA block 56 and the second PA block 66 are only partially energized. However, in contrast to the operation depicted in FIG. 7, the first-first PA 58 and the second-second PA 70 are deactivated, while the second first PA 68 is energized by the first modulated switcher 60 and the first-second PA 62 is energized by the second modulated switcher 64. Yet, the first and second throws of the first SP2T switch 74 and the second switch 78 remain closed by the control signals CTRL1_1 and CTRL2_1. In this way, the band A receive signal RX_A captured by the first antenna 80 is output from the first duplexer 72, and the band B receive signal RX_B also captured by first antenna 80 is output from the third duplexer 84. Moreover, the band A diversity/MIMO receive signal RX_A_DIV captured by the second antenna 82 is output from the second duplexer 76, while the band B diversity/MIMO receive signal is output from the fourth duplexer 86. Further still, the carrier C2A is transmitted from the second antenna 82, while the carrier C1B is transmitted from the first antenna 80.

The FERA 52 allows envelope tracking for dual carriers in both intra-band and inter-band operation, which eliminates a need for an extra 1 dB of PAR. As a result, the FERA 52 offers improved efficiency for dual carrier operation. Moreover, intermodulation distortion is reduced due to separated transmitter chains comprised of the first PA block 56 and the second PA block 66. Further still, the configuration of the first SP2T switch 74 and the second SP2T switch 78 combined with the first duplexer 72, the second duplexer 76, the third duplexer 84, and the fourth duplexer 86 allows for carrier transmission diversity. However, these advantages offered by the FERA 52 come with an increased bill of materials (BOM) cost of an extra TX filter per band. Also, unless the extra complexity of a half-power split type amplifier is implemented an additional cost of an extra PA block is included in the FERA 52.

Figure 9:
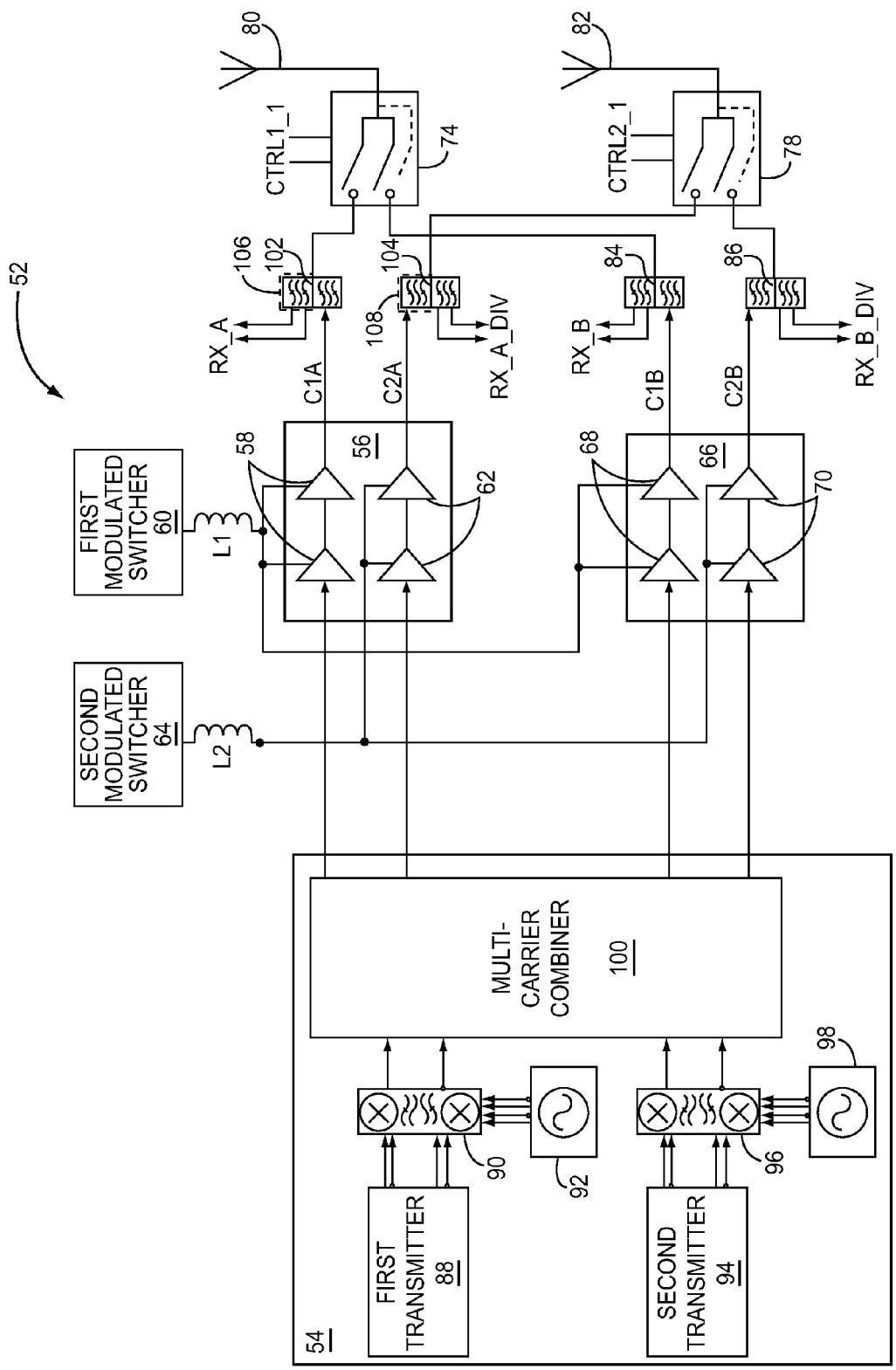
FIG. 9 is a schematic of the FERA that is modified to reduce BOM costs by including split band duplexers for band A.

FIG. 9 is a schematic of the FERA 52 that is modified to reduce BOM costs by replacing the first duplexer 72 with a first split band duplexer 102, and by replacing the second duplexer 76 with a second split band duplexer 104. The first split band duplexer 102 includes a first TX filter 106 for passing the carrier C1A located in the lower half TX band of band A. Similarly, the second split band duplexer 104 includes a second TX filter 108 for passing the carrier C2A located in the upper half TX band of band A. The combined bandwidth of the first TX filter 106 and the second TX filter 108 is adaptable to cover the upper and lower halves of a given TX band.

Figure 10:
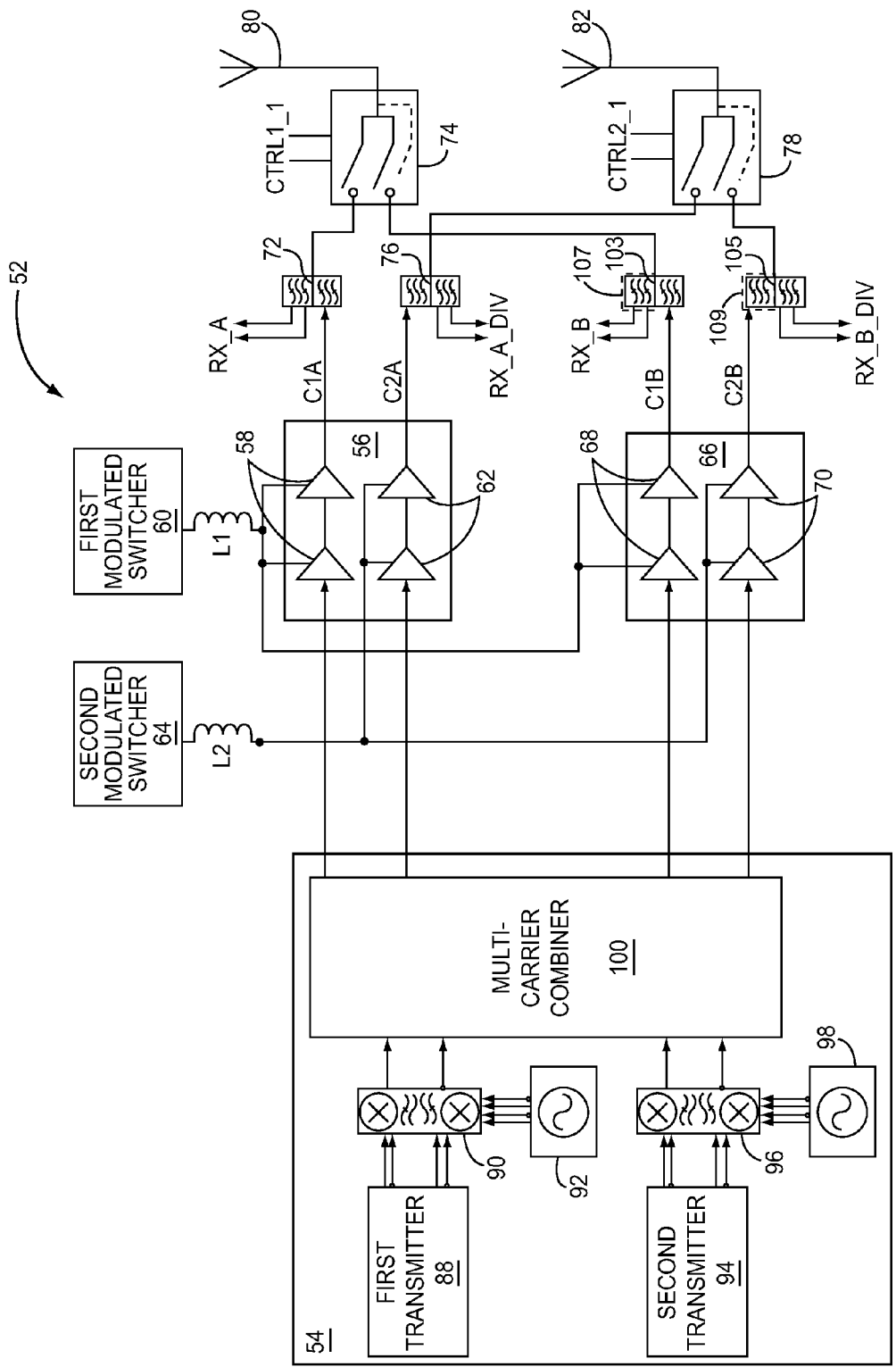
FIG. 10 is a schematic of the FERA that is modified to reduce BOM costs by including split band duplexers for band B.

FIG. 10 is a schematic of the FERA 52 that is also modified to reduce BOM costs by replacing the third duplexer 84 with a third split band duplexer 103, and by replacing the fourth duplexer 86 with a fourth split band duplexer 105. A third TX filter 107 passes the carrier C1B located in the lower half TX band of band B. Similarly, a fourth TX filter 109 passes the carrier C2B located in the upper half TX band of band B.

One modification to the FERA 52 would allow a transmission of both halves of band A from the first antenna 80 and both halves of band B from the other antenna 82 by tuning the first PA block 56 for the carriers C1A and C1B, and the second PA block 66 for the carriers C2A and C2B. In this case, the first modulated switcher 60 would supply the second-second PA 70 and the second modulated switcher 64 would supply the second-first PA 68. In this way, the first antenna 80 would only be associated with band A and the second antenna 82 would only be associated with band B. However, IMD could be an issue with this implementation since the two half band carriers may not have enough antenna isolation between them. In contrast, the RX_A_DIV output and the RX_B_DIV output could remain as is shown in FIG. 3. The resulting receiver and transmitter separation would be relatively large. Thus, reducing the design requirements for filtering.

Figure 11:
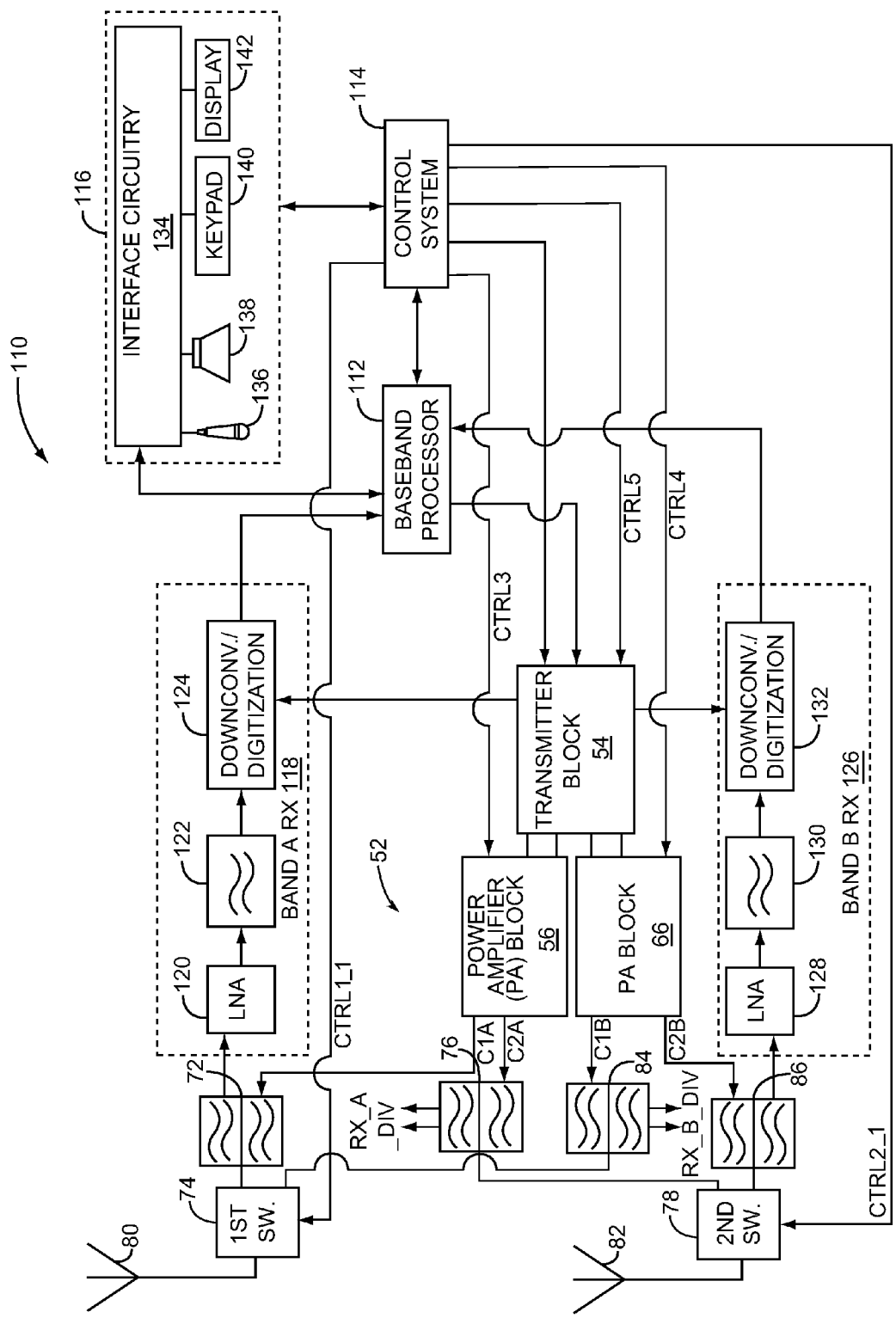
FIG. 11 depicts a mobile terminal that incorporates the FERA of the present disclosure.

FIG. 11 depicts user equipment (UE) in the form of a mobile terminal 110 that incorporates a preferred embodiment of the FERA 52 of the present disclosure. The mobile terminal 110 may be, but is not limited to, a mobile telephone, a personal digital assistant (PDA), or the like. The basic architecture of the mobile terminal 110 may also include a baseband processor 112, a control system 114, and an interface 116. The first antenna 80 receives information-bearing RF signals from one or more remote transmitters provided by a base station (not shown). The first switch 74 under the control of the CTRL1_1 signal output from the control system 114 allows the information-bearing RF signals to feed through the first duplexer 72 and into a band A RX 118. The band A RX 118 includes a low noise amplifier (LNA) 120 that amplifies the signal, and a first filter circuit 122 that minimizes broadband interference in the received signals. The band A RX 118 also includes downconversion and digitization circuitry 124, which downconverts the filtered, received signals to intermediate or baseband frequency signals, which are then digitized into one or more digital streams.

Similarly, the second antenna 82 receives information-bearing RF signals from one or more remote transmitters provided by a base station (not shown). The second switch 78 under the control of the CTRL2_1 signal output from the control system 114 allows the information-bearing signals to feed through the fourth duplexer 86 and into a band B RX126. The band B RX126 includes a second LNA 128 that amplifies the signals, and a second filter circuit 130 that minimizes broadband interference in the received signals. The band B RX126 also includes downconversion and digitization circuitry 132, which downconverts the filtered, received signals to intermediate or baseband frequency signals, which are then digitized into one or more digital streams.

The baseband processor 112 processes the digitized received signals to extract the information or data bits conveyed in the received signals. This processing typically comprises demodulation, decoding, and error correction operations. As such, the baseband processor 112 is generally implemented in one or more digital signal processors (DSPs).

On the transmit side, the baseband processor 112 receives digitized data, which may represent voice, data, or control information, which it encodes for transmission, from the control system 114. The encoded data is output to the transmitter block 54. The PA blocks 56 and 66 amplify the carriers C1A, C2A, C1B, and C2B to levels appropriate for transmission from the first antenna 80 and the second antenna 82. Different combinations of the carriers C1A, C2A, C1B, and C2B may also be transmitted from the first antenna 80 and the second antenna 82 under control of the control signals CTRL1_1 and CTRL 2_1, as described previously.

A user may interact with the mobile terminal 110 via the interface 116, which may include interface circuitry 134 associated with a microphone 136, a speaker 138, a keypad 140, and a display 142. The interface circuitry 134 typically includes analog-to-digital converters, digital-to-analog converters, amplifiers, and the like. Additionally, it may include a voice encoder/decoder, in which case it may communicate directly with the baseband processor 112.

The microphone 136 will typically convert audio input, such as the user's voice, into an electrical signal, which is then digitized and passed directly or indirectly to the baseband processor 112. Audio information encoded in the received signal is recovered by the baseband processor 112 and converted by the interface circuitry 134 into an analog signal suitable for driving the speaker 138. The keypad 140 and the display 142 enable the user to interact with the mobile terminal 110, inputting numbers to be dialed, address book information, or the like, as well as monitoring call progress information.

Those skilled in the art will recognize improvements and modifications to the embodiments of the present disclosure. All such improvements and modifications are considered within the scope of the concepts disclosed herein and the claims that follow.

What is claimed is:

1. A front end radio architecture (FERA) with power management comprising:
    a first power amplifier (PA) block having a first-first PA and a first-second PA;
    a second PA block having a second-first PA and a second-second PA;
    a first modulated switcher adapted to selectively supply power to the first-first PA and the second-first PA;
    a second modulated switcher adapted to selectively supply power to the first-second PA and the second-second PA; and
    a control system adapted to selectively enable and disable the first-first PA, the first-second PA, the second-first PA, and the second-second PA.

2. The FERA of claim 1 further including:
    a first switch having a first control input, a first throw terminal, a second throw terminal, and a first pole terminal coupled to a first throw and a second throw, wherein the first switch is responsive to a first control signal to selectively close and open the first throw with the first throw terminal, and to selectively close and open the second throw with the second throw terminal; and
    a second switch having a second control input, a third throw terminal, a fourth throw terminal, and a second pole terminal coupled to a third throw and a fourth throw, wherein the second switch is responsive to a second control signal to selectively close and open the third throw with the third throw terminal, and to selectively close and open the fourth throw with the fourth throw terminal.

3. The FERA of the claim 2 further including:
    a first duplexer coupled between an output of the first-first PA and the first throw terminal;
    a second duplexer coupled between an output of the first-second PA and the third throw terminal;
    a third duplexer coupled between an output of the second-first PA and the second throw terminal; and
    a fourth duplexer coupled between an output of the second-second PA and the fourth throw terminal.

4. The FERA of claim 3 wherein the control system is further adapted to enable the first PA block, disable the second PA block, close the first throw with the first throw terminal, and close the third throw with the third throw terminal to realize an intra-band carrier aggregation mode.

5. The FERA of claim 3 wherein the control system is further adapted to disable the first PA block, enable the second PA block, close the second throw with the second throw terminal, and close the fourth throw with the fourth throw terminal to realize an intra-band carrier aggregation mode.

6. The FERA of claim 3 wherein the control system is further adapted to enable the first-first PA, disable the first-second PA, disable the second-first PA, enable the second-second PA, close the first throw with the first throw terminal, and close the fourth throw with the fourth throw terminal to realize an inter-band operation mode between a first predetermined band and a second predetermined band.

7. The FERA of claim 3 wherein the control system is further adapted to enable the first-first PA, disable the first-second PA, disable the second-first PA, enable the second-second PA, close the first throw with the first throw terminal, close the second throw with the second throw terminal, close the third throw with the third throw terminal, and close the fourth throw with the fourth throw terminal to realize an inter-band operation mode between a first predetermined band and a second predetermined band while including a receive diversity/MIMO mode.

8. The FERA of claim 3 wherein the control system is further adapted to disable the first-first PA, enable the first-second PA, enable the second-first PA, disable the second-second PA, close the first throw with the first throw terminal, close the second throw with the second throw terminal, close the third throw with the third throw terminal, and close the fourth throw with the fourth throw terminal to realize an inter-band operation mode between a first predetermined band and a second predetermined band while including a receive diversity using MIMO in a swapped transmit carriers mode.

9. The FERA of claim 3 wherein the first duplexer and the second duplexer are split band duplexers.

10. The FERA of claim 3 wherein the third duplexer and the fourth duplexer are split band duplexers.

11. The FERA of claim 1 wherein the first modulated switcher and the second modulated switcher each have a modulation bandwidth of at least 20 MHz.

12. The FERA of claim 1 wherein the first modulated switcher and the second modulated switcher are each adapted to be modulated by an envelope following signal.

13. The FERA of claim 1 further including a transmitter block comprising:
a first transmitter;
a first radio frequency (RF) phase locked loop (PLL);
a first RF modulator coupled to the first transmitter and the first RF PLL;
a second transmitter;
a second RF PLL;
a second RF modulator coupled to the second transmitter and the second RF PLL; and
a multi-carrier combiner coupled between the first RF modulator and the second RF modulator.

14. A mobile terminal comprising:
a first antenna;
a second antenna;
a FERA with power management comprising:
a first power amplifier (PA) block having a first-first PA and a first-second PA;
a second PA block having a second-first PA and a second-second PA;
a first modulated switcher adapted to selectively supply power to the first-first PA and the second-first PA;
a second modulated switcher adapted to selectively supply power to the first-second PA and the second-second PA; and
a control system adapted to selectively enable and disable the first-first PA, the first-second PA, the second-first PA, and the second-second PA.

15. The mobile terminal of claim 14 further including:
a first switch having a first control input, a first throw terminal, a second throw terminal, and a first pole terminal coupled to a first throw and a second throw, wherein the first switch is responsive to a first control signal to selectively close and open the first throw with the first throw terminal, and to selectively close and open the second throw with the second throw terminal; and
a second switch having a second control input, a third throw terminal, a fourth throw terminal, and a second pole terminal coupled to a third throw and a fourth throw, wherein the second switch is responsive to a second control signal to selectively close and open the third throw with the third throw terminal, and to selectively close and open the fourth throw with the fourth throw terminal.

16. The FERA of the claim 15 further including:
a first duplexer coupled between an output of the first-first PA and the first throw terminal;
a second duplexer coupled between an output of the first-second PA and the third throw terminal;
a third duplexer coupled between an output of the second-first PA and the second throw terminal; and
a fourth duplexer coupled between an output of the second-second PA and the fourth throw terminal.

17. The mobile terminal of claim 16 wherein the control system is further adapted to enable the first PA block, disable the second PA block, close the first throw with the first throw terminal, and close the third throw with the third throw terminal to realize an intra-band carrier aggregation mode.

18. The mobile terminal of claim 16 wherein the control system is further adapted to disable the first PA block, enable the second PA block, close the second throw with the second throw terminal, and close the fourth throw with the fourth throw terminal to realize an intra-band carrier aggregation mode.

19. The mobile terminal of claim 16 wherein the control system is further adapted to enable the first-first PA, disable the first-second PA, disable the second-first PA, enable the second-second PA, close the first throw with the first throw terminal, and close the fourth throw with the fourth throw terminal to realize an inter-band operation mode between a first predetermined band and a second predetermined band.

20. The mobile terminal of claim 16 wherein the control system is further adapted to enable the first-first PA, disable the first-second PA, disable the second-first PA, enable the second-second PA, close the first throw with the first throw terminal, close the second throw with the second throw terminal, close the third with the third throw terminal, and close the fourth throw with the fourth throw terminal to realize an inter-band operation mode between a first predetermined band and a second predetermined band while including a receive diversity/MIMO mode.

21. The mobile terminal of claim 16 wherein the control system is further adapted to disable the first-first PA, enable the first-second PA, enable the second-first PA, disable the second-second PA, close the first throw with the first throw terminal, close the second throw with the second throw terminal, close the third throw with the third throw terminal, and close the fourth throw with the fourth throw terminal to realize an inter-band operation mode between a first predetermined band and a second predetermined band while including a receive diversity using MIMO in a swapped transmit carriers mode.

22. The mobile terminal of claim 16 wherein the first duplexer and the second duplexer are split band duplexers.

23. The mobile terminal of claim 16 wherein the third duplexer and the fourth duplexer are split band duplexers.

24. The mobile terminal of claim 14 wherein the first modulated switcher and the second modulated switcher each have a modulation bandwidth of at least 20 MHz.

25. The mobile terminal of claim 14 wherein the first modulated switcher and the second modulated switcher are each adapted to be modulated by an envelope following signal.

26. The mobile terminal of claim 14 wherein the FERA further includes a transmitter block comprising:
a first transmitter;
a first radio frequency (RF) phase locked loop (PLL);
a first RF modulator coupled to the first transmitter and the first RF PLL;
a second transmitter;
a second RF PLL;

a second RF modulator coupled to the second transmitter and the second RF PLL; and a multi-carrier combiner coupled between the first RF modulator and the second RF modulator.

* * * * *